(12) United States Patent
Van Dam (10) Patent No.: US 11,859,470 B2
(45) Date of Patent: Jan. 2, 2024

(54) EXTRACTING HYDROCARBONS FROM A SUBTERRANEAN HYDROCARBON RESERVOIR BASED ON AN ARTIFICIAL LIFT PLAN

(71) Applicant: Jeremy Daniel Van Dam, Edmond, OK (US)

(72) Inventor: Jeremy Daniel Van Dam, Edmond, OK (US)

(73) Assignee: BAKER HUGHES HOLDINGS LLC, Houston, TX (US)

( * ) Notice: Subject to any disclaimer, the term of this patent is extended or adjusted under 35 U.S.C. 154(b) by 803 days.

(21) Appl. No.: 16/012,301

(22) Filed: Jun. 19, 2018

(65) Prior Publication Data

US 2019/0383122 A1     Dec. 19, 2019

(51) Int. Cl.
*E21B 41/00*   (2006.01)
*E21B 43/12*   (2006.01)
(Continued)

(52) U.S. Cl.
CPC ........ *E21B 41/0092* (2013.01); *E21B 43/121* (2013.01); *G06F 30/20* (2020.01);
(Continued)

(58) Field of Classification Search
CPC ............ E21B 41/0092; E21B 43/121; E21B 2200/20; E21B 2200/22; E21B 44/00;
(Continued)

(56) References Cited

U.S. PATENT DOCUMENTS

| 8,988,236 | B2 * | 3/2015 | Liu ................. | E21B 47/009 340/679 |
| 2013/0173505 | A1 * | 7/2013 | Balogun ............ | E21B 43/121 702/6 |

(Continued)

FOREIGN PATENT DOCUMENTS

| WO | 2017074883 A1 | 5/2017 |
| WO | 20170210585 A1 | 12/2017 |

OTHER PUBLICATIONS

Kalu-Ulu, T. C, Andrawus, J. A, and I. P. George. "Modelling System Failures of Electric Submersible Pumps in Sand Producing Wells." Paper presented at the Nigeria Annual International Conference and Exhibition, Abuja, Nigeria, Jul. 2011. (Year: 2011).*

(Continued)

*Primary Examiner* — Michael Edward Cocchi
(74) *Attorney, Agent, or Firm* — CANTOR COLBURN LLP (57) ABSTRACT

Examples of techniques for extracting hydrocarbons from a subterranean hydrocarbon reservoir based on an artificial lift plan are disclosed. In one example implementation according to aspects of the present disclosure, a method includes performing, by a processing device, an evaluation of an artificial lift approach that can be operated at a well having a subterranean hydrocarbon reservoir, the evaluation being based at least in part on a static factor associated with operating the artificial lift approach in the well and a dynamic factor associated with operating the artificial lift approach at a operating condition. The method further includes generating, by the processing device, an artificial lift plan based at least in part on the evaluation. The method further includes extracting the hydrocarbons from the subterranean hydrocarbon reservoir based on the artificial lift plan by operating, at the well, the artificial lift approach.

16 Claims, 9 Drawing Sheets

(51) Int. Cl.
  *G06F 30/20* (2020.01)
  *G06Q 10/06* (2023.01)
(52) U.S. Cl.
  CPC .......... *G06Q 10/06* (2013.01); *E21B 2200/20* (2020.05); *E21B 2200/22* (2020.05)
(58) Field of Classification Search
  CPC ........ E21B 43/122; E21B 41/00; E21B 43/00; E21B 43/16; E21B 43/13; E21B 33/00; E21B 19/20; E21B 21/08; E21B 47/12; G06Q 10/06; G06F 30/20; G06F 30/25; G06F 30/27; G06F 30/28
  See application file for complete search history.

(56) References Cited

U.S. PATENT DOCUMENTS

| | | | |
|---|---|---|---|
| 2015/0241881 A1* | 8/2015 | Ige | E21B 43/128 |
| | | | 700/282 |
| 2016/0053753 A1* | 2/2016 | Rashid | E21B 43/122 |
| | | | 700/282 |
| 2016/0273315 A1* | 9/2016 | Carvajal | E21B 41/0092 |
| 2017/0096889 A1* | 4/2017 | Blanckaert | E21B 44/00 |
| 2017/0351272 A1 | 12/2017 | Rasheed et al. | |
| 2017/0351959 A1* | 12/2017 | Rasheed | G06N 5/04 |
| 2017/0351984 A1* | 12/2017 | Rasheed | G06Q 50/06 |
| 2018/0321421 A1* | 11/2018 | Halabe | G01V 99/005 |

OTHER PUBLICATIONS

Agarwal, Amit Kumar, Purwar, Suryansh , and Cesar Enrique Bravo. "Real-time Diagnostic Analysis of Artificially Lifted Wells: A Smart Workflow Approach." Paper presented at the SPE Intelligent Energy Conference & Exhibition, Utrecht, The Netherlands, Apr. 2014 (Year: 2014).*

Fatahi et al., "Selection of the Best Artificial Lift Method in One of the Iranian Oil Field by the Employment of ELECTRE Model", British Journal of Applied Science & Technology 1(4), Sep. 28, 2011, pp. 172-180. See pp. 172-174.

Espin et al., "Expert System for Selection of Optimum Artificial Lift Method", Third Latin American/Caribbean Petroleum Engineering Conference, Apr. 1994, pp. 691-699. See pp. 691-692(abstract only).

International Search Report and the Written Opinion of the International Search Authority, or the Declaration; PCT/US2019/037045; dated Dec. 26, 2019; 8 pages.

Australian Office Action Issued in Australian Application No. 2019289089 dated Feb. 19, 2021; 5 Pages.

European Search Report Issued in European Application No. 19822112.9-1002 / 3810891 PCT/US2019/037056 dated Apr. 11, 2022; 10 Pages.

* cited by examiner

EXTRACTING HYDROCARBONS FROM A SUBTERRANEAN HYDROCARBON RESERVOIR BASED ON AN ARTIFICIAL LIFT PLAN

BACKGROUND

The present disclosure relates generally to wellbore operations and more particularly to extracting hydrocarbons from a subterranean hydrocarbon reservoir based on an artificial lift plan.

Hydrocarbon exploration and energy industries employ various systems and operations to accomplish activities including drilling, formation evaluation, stimulation, and production. Various techniques may be employed to facilitate hydrocarbon exploration and production activities.

Methods for extraction of hydrocarbons from subterranean reservoirs have advanced in recent years. Wells may produce mixtures of oil, water, and gas at rapidly changing rates. Wellbores of the wells may also have significant deviations from straight-line trajectories. Further complications include the production of asphaltenes, parrafins, corrosive chemicals, scaling agents, and abrasive solid particles. Viable production from such wells can depend on the use of artificial lifting equipment, and the proper selection of this equipment influences the overall production capabilities of the wells.

BRIEF SUMMARY

Embodiments of the invention described herein provide systems, methods, and computer program products for extracting hydrocarbons from a subterranean hydrocarbon reservoir based on an artificial lift plan. In one embodiment, a method includes performing, by a processing device, an evaluation of an artificial lift approach that can be operated at a well having a subterranean hydrocarbon reservoir, the evaluation being based at least in part on a static factor associated with operating the artificial lift approach in the well and a dynamic factor associated with operating the artificial lift approach at a operating condition. The method further includes generating, by the processing device, an artificial lift plan based at least in part on the evaluation. The method further includes extracting the hydrocarbons from the subterranean hydrocarbon reservoir based on the artificial lift plan by operating, at the well, the artificial lift approach.

In another embodiment, a method includes performing, by a processing device, a first evaluation of a first artificial lift approach that can be operated at a well having a subterranean hydrocarbon reservoir, the first evaluation being based at least in part on a first static factor associated with operating the first artificial lift approach in the well and a first dynamic factor associated with operating the first artificial lift approach at a first operating condition. The method further includes performing, by a processing device, a second evaluation of a second artificial lift approach that can be operated at the well having the subterranean hydrocarbon reservoir, the second evaluation being based at least in part on a second static factor associated with operating the second artificial lift approach in the well and a second dynamic factor associated with operating the second artificial lift approach at a second operating condition. The method further includes generating, by the processing device, an artificial lift plan based at least in part on the first evaluation and the second evaluation. The method further includes extracting the hydrocarbons from the subterranean hydrocarbon reservoir based on the artificial lift plan by operating, at the well, at least one of the first artificial lift approach and the second artificial lift approach.

In yet another embodiment, a system includes a memory comprising computer readable instructions and a processing device for executing the computer readable instructions for performing a method. The method includes performing, by the processing device, a first evaluation of a first artificial lift approach that can be operated at a well having a subterranean hydrocarbon reservoir, the first evaluation being based at least in part on a first static factor associated with operating the first artificial lift approach in the well and a first dynamic factor associated with operating the first artificial lift approach at a first operating condition. The method further includes performing, by a processing device, a second evaluation of a second artificial lift approach that can be operated at the well having the subterranean hydrocarbon reservoir, the second evaluation being based at least in part on a second static factor associated with operating the second artificial lift approach in the well and a second dynamic factor associated with operating the second artificial lift approach at a second operating condition. The method further includes generating, by the processing device, an artificial lift plan based at least in part on the first evaluation and the second evaluation. The method further includes extracting the hydrocarbons from the subterranean hydrocarbon reservoir based on the artificial lift plan by operating, at the well, at least one of the first artificial lift approach and the second artificial lift approach.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages thereof, are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

A detailed description of one or more embodiments of the disclosed system, apparatus, and method presented herein by way of exemplification and not limitation with reference to the figures. Disclosed are techniques for extracting hydrocarbons from a subterranean hydrocarbon reservoir based on an artificial lift plan.

In some wellbore operations, fluids, such as crude oil and water, flow to the surface of the Earth without assistance due to the natural pressures within a reservoir. These are referred to as natural lift or natural flow reservoirs. However, many reservoirs do not have sufficient pressure to lift produced fluids to the surface of the Earth. Artificial lift increases the flow of these fluids in a wellbore operation to overcome insufficient pressures in the reservoir.

Figure 1:
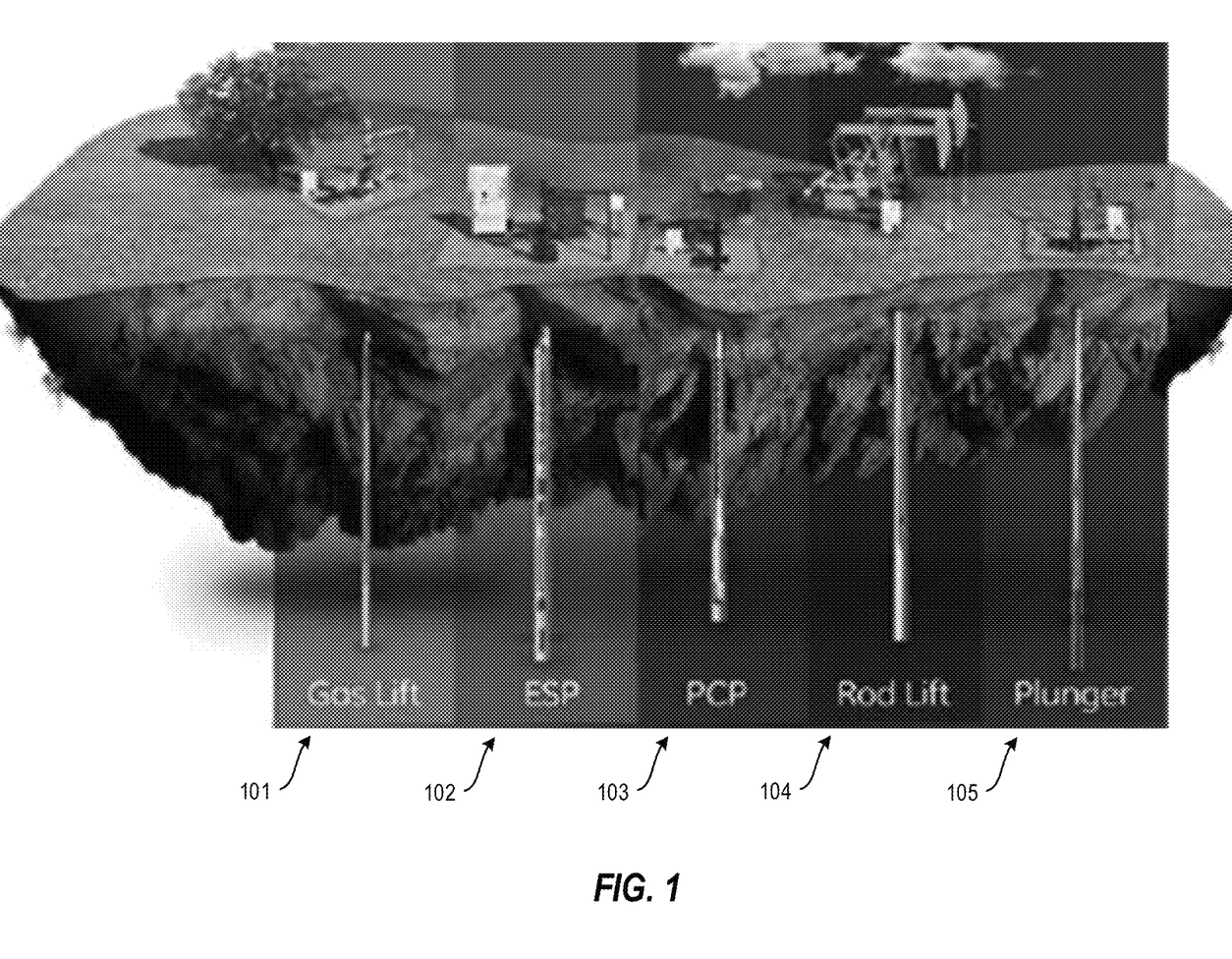
FIG. 1 depicts examples of artificial lift approaches according to one or more embodiments described herein.

Various artificial lift approaches can be implemented depending on wellbore operation properties, formation properties, reservoir properties, the life of the wellbore expectations, an amount of pressure needed to increase fluid flow, and other factors. FIG. 1 depicts examples of artificial lift approaches according to one or more embodiments described herein. In particular, examples of types of artificial lift approaches can include a gas lift system 101, an electric submersible pump (ESP) system 102, a progressing cavity pumping system 103, a rod lift system 104, a plunger lift system 105, and the like. It should be appreciated that other systems/approaches can also be implemented, such as linear electric pumping systems, and/or combinations of these systems/approaches. One artificial lift approach may be better suited for a certain type of wellbore operation, for example, while not being as suitable for another type of wellbore operation. For example, an ESP-based approach may be better suited for deep wellbores producing thousands of barrels per day than a rod lift system.

Frequently multiple artificial lift approaches may be suitable for a particular wellbore operation, and a decision must be made regarding which artificial lift approach to use. Selecting a non-ideal artificial lift approach can result in a reduced (non-ideal) production rate, lower (non-ideal) total production volumes (i.e., lower ultimate recovery), and the like, compared to an ideal artificial lift approach. Moreover, during the production lifetime of a reservoir, conditions may change; thus, what was once an ideal artificial lift approach can become non-ideal. Accordingly, it may be desirable to change artificial lift approaches over the life of a well.

Figure 2:
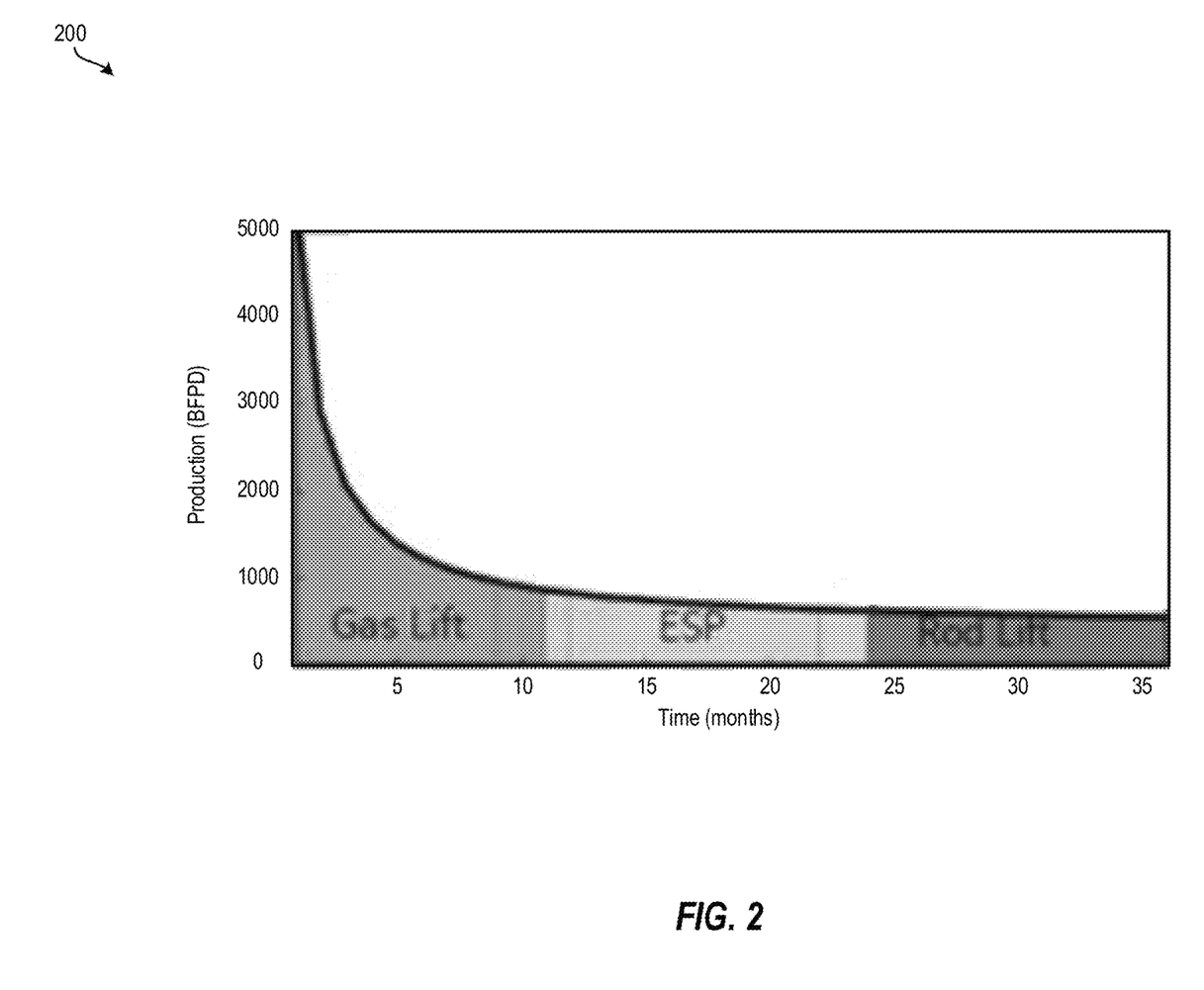
FIG. 2 depicts an artificial lift plan for a well according to one or more embodiments described herein.

An example of an artificial lift plan is now described. In particular, FIG. 2 depicts an artificial lift plan 200 for a well according to one or more embodiments described herein.

The artificial lift plan 200 shows production (in barrels of fluid per day (BFPD)) plotted over time (in months). As shown, three different artificial lift approaches are used depending on the life of the well. In the example of FIG. 2, a gas lift approach is implemented for the first approximately eleven months. After this period, an ESP-based approach is implemented until approximately twenty-four months (total lifetime of the well), at which point a rod lift approach is used.

Existing techniques for developing an artificial lift plan rely on expertise and experience of individuals responsible for well production. Since experience and expertise vary significantly, reliance on individuals to address factors associated with production when developing artificial lift plans has led to considerable challenges due to bias and inconsistency. For instance, two similar wells use significantly different artificial lift plans depending on the experience and biases of the individuals who developed the artificial lift plans for the two wells. In an attempt to standardize the application of experience and reduce biases, prior techniques have attempted to apply rules based on captured knowledge from subject matter experts. However, these rules fail to consider, and are incapable of considering, changes to factors (dynamic factors) and lifetime-based factors.

The technical solutions provide for developing an improved artificial lift plan over prior techniques by considering static factors, dynamic factors, and lifetime-based factors. Accordingly, the present techniques characterize changing conditions over the life of the well by identifying dynamic factors (i.e., factors that change over time), analyzing these dynamic factors along with static factors and lifetime-based factors, and developing an improved artificial lift plan that accounts for the static factors, dynamic factors, and lifetime-based factors. Consideration of dynamic factors and lifetime-based factors in combination with static factors allows a superior sequence of artificial lift configurations to be selected, thereby reducing likelihood of equipment failure, increasing system performance, enhancing production, increasing the viable life of a well, and increasing total ultimate recovery.

The present techniques determine a total risk associated with operating various artificial lift approaches in a particular well under certain operating conditions. The total risk is calculated such that static factors known to influence artificial lift approaches (and the equipment associated therewith) efficacy or life are combined with dynamic factors that change over time. In this way, the impact of running equipment under non-ideal conditions, away from nominally rated design points, and for extended periods of time, can be accessed. A compromise can then be made between performance and technical risk, and a sequence of artificial lift approaches (i.e., an artificial lift plan) can be planned to achieve enhanced production and recover a greater portion of the available hydrocarbon resources in a reservoir.

Static factors (also referred to as "static risk factors") are factors that are associated with operating a particular lift configuration in a particular well and do not change over the period of operation. One example is the risk of premature tubing wear associated with running a rod-driven pump where the rods extend through a highly deviated wellbore. Another example is the risk of premature electric submersible pump failure when operated in a highly corrosive environment. Both of these examples of static factors are expected to apply over the entire life of the well and therefore are static.

Dynamic factors (also referred to as "dynamic risk factors") are factors associated with operating a particular lift configuration at a given operating condition and can change over the period of operation. One example is the risk of premature pump failure when running a rotating pump above its rated speed (such as running the pump at 150% of its rated speed). Another example is the risk of poor pumping performance that may include gas-lock when operating an ESP during a period of high gas production. Both of these factors can occur at specific intervals during the well production lifetime, and since the conditions driving these factors are expected to change over time, these factors are dynamic.

Lifetime-based factors (also referred to as "lifetime-based risk factors") are a function of the operating time for an artificial lift configuration. In other words, different types of artificial lift approaches are expected to have some maximum run lifetime, and the risk of failure increases as the operating time approaches the maximum run lifetime. Infant mortality may also be addressed as an increased risk level at the beginning of an operating interval for a pump that diminishes as time goes on.

Figure 3:
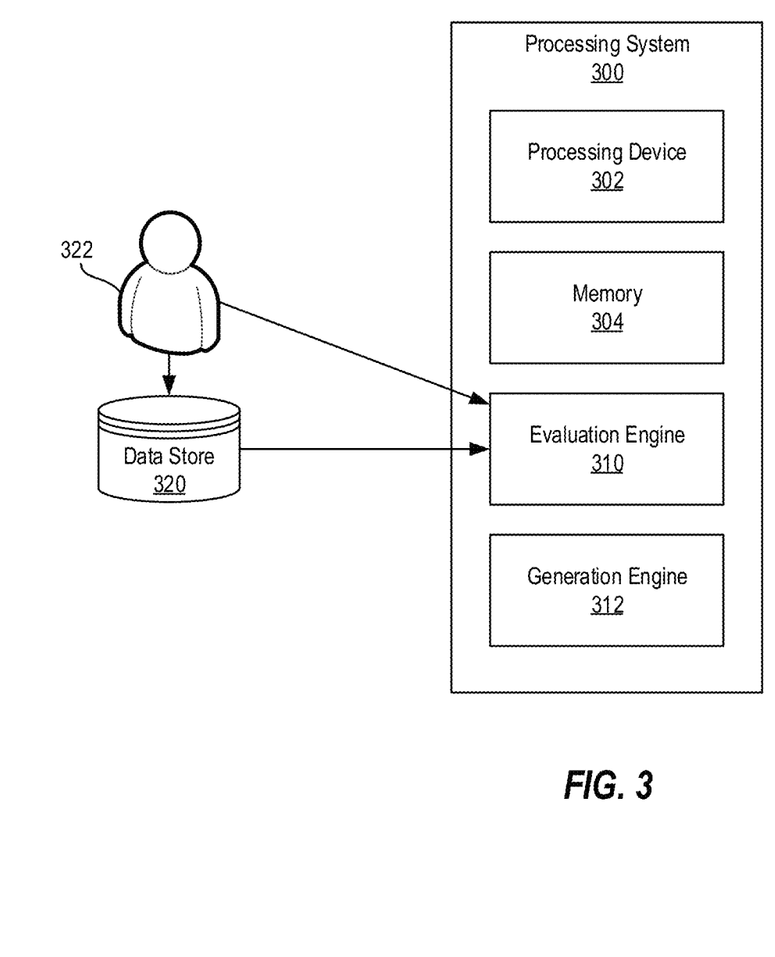
FIG. 3 depicts a block diagram of a processing system for extracting hydrocarbons from a subterranean hydrocarbon reservoir based on an artificial lift plan according to one or more embodiments described herein.

FIG. 3 depicts a block diagram of a processing system 300 for extracting hydrocarbons from a subterranean hydrocarbon reservoir based on an artificial lift plan according to one or more embodiments described herein. The processing system 300 includes a processing device 302, a memory 304, an evaluation engine 310, a generation engine 312, and a data store 320.

The components, modules, engines, etc. described regarding FIG. 10 can be implemented as instructions stored on a computer-readable storage medium, as hardware modules, as special-purpose hardware (e.g., application specific hardware, application specific integrated circuits (ASICs), application specific special processors (ASSPs), field programmable gate arrays (FPGAs), as embedded controllers, hardwired circuitry, etc.), or as some combination or combinations of these. According to aspects of the present disclosure, the engine(s) described herein can be a combination of hardware and programming. The programming can be processor executable instructions stored on a tangible memory, and the hardware can include the processing device 302 for executing those instructions. Thus a system memory (e.g., the memory 304) can store program instructions that when executed by the processing device 302 implement the engines described herein. Other engines can also be utilized to include other features and functionality described in other examples herein.

Figure 4:
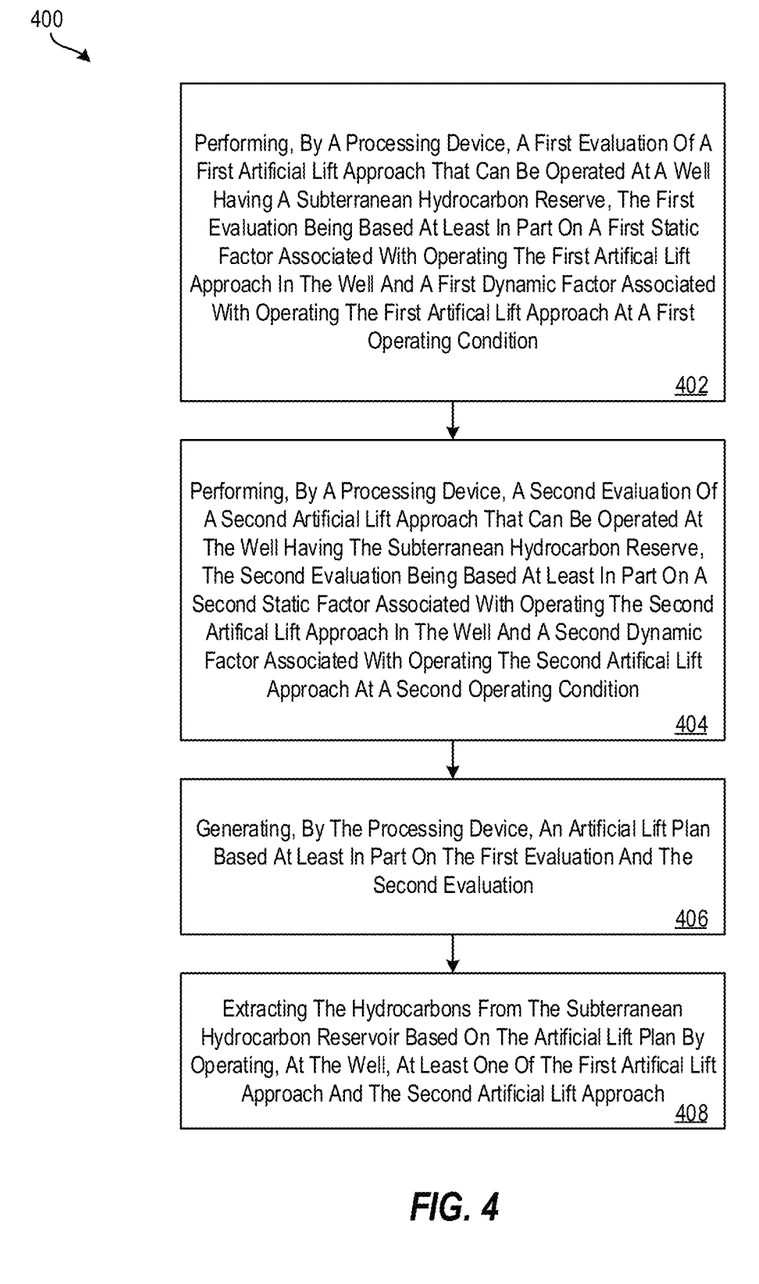
FIG. 4 depicts a flow diagram of a method for extracting hydrocarbons from a subterranean hydrocarbon reservoir based on an artificial lift plan according to one or more embodiments described herein.
Figure 8:
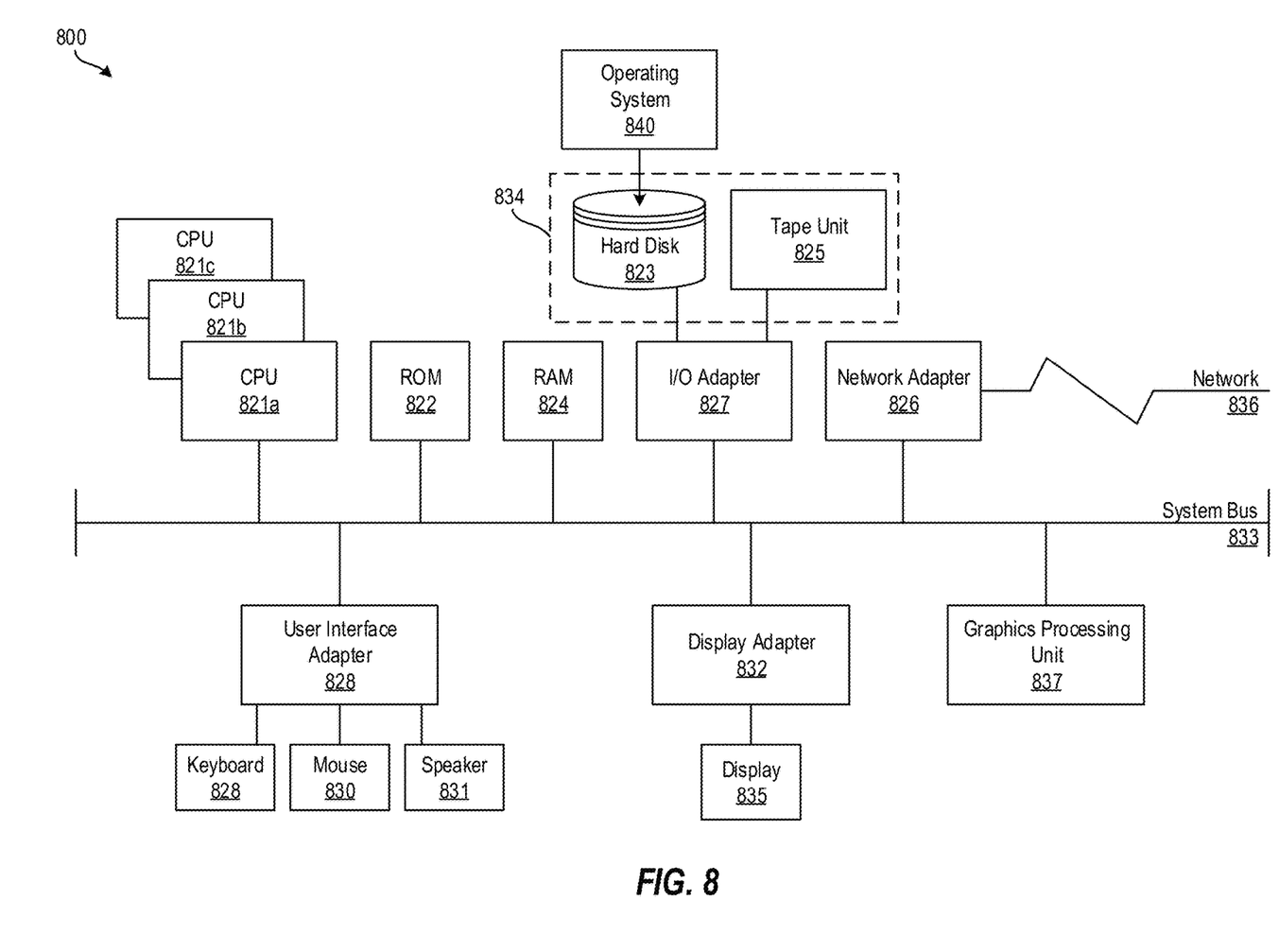
FIG. 8 depicts a block diagram of a processing system for implementing the techniques described herein according to aspects of the present disclosure.

The functionality of the processing system 300 and its components are now described with reference to FIG. 4. In particular, FIG. 4 depicts a flow diagram of a method 400 for extracting hydrocarbons from a subterranean hydrocarbon reservoir based on an artificial lift plan according to one or more embodiments described herein. The method 400 can be performed by any suitable processing system and/or processing device, such as the processing system 300 of FIG. 3 and/or the processing system 800 of FIG. 9.

At block 402, the evaluation engine 310 performs a first evaluation of a first artificial lift approach that can be operated at a well having a subterranean hydrocarbon reservoir. The first evaluation is based at least in part on a first static factor and a first dynamic factor. The first static factor is a factor associated with operating the first artificial lift approach in the well and the first dynamic factor is a factor associated with operating the first artificial lift approach at a first operating condition. The static and dynamic factors can be stored in a data store, such as the data store 320, and/or provided by a user, such as the user 322.

According to an example, the first artificial lift approach is a rod lift approach (e.g., using the rod lift system 104 of FIG. 1). In this case, an example of a static factor is that the rods extend through a highly deviated wellbore, and this can cause excess wear and tear on components of the rod lift system 104. An example of a dynamic factor is that the rod driven pump of the rod lift system 104 may be at risk of premature pump failure when running at 150% of its rated speed. The evaluation engine 310 evaluates the static and dynamic factors of the rod lift approach to determine whether it should be implemented in a particular well and, if so, when and for how long.

At block 404, the evaluation engine 310 performs a second evaluation of a second artificial lift approach that can be operated at the well having the subterranean hydrocarbon reservoir. The second evaluation is based at least in part on a second static factor and a second dynamic factor. The first static factor is a factor associated with operating the second artificial lift approach in the well and the second dynamic factor is a factor associated with operating the second artificial lift approach at a second operating condition.

According to an example, the second artificial lift approach is an ESP approach (e.g., using the ESP system 102 of FIG. 1). In this case, an example of a static factor is that the ESP can fail when operated in a highly corrosive environment. An example of a dynamic factor is gas-lock may occur when operating an ESP during a period of high gas production. The evaluation engine 310 evaluates the static and dynamic factors of the ESP approach to determine whether it should be implemented in a particular well and, if so, when and for how long.

At block 406, the generation engine 312 generates an artificial lift plan (e.g. the artificial lift plan 200) based at least in part on the first evaluation and the second evaluation. The artificial lift plan indicates which artificial lift approach should be used at a particular well, when, and for how long. The artificial lift plan, which accounts for both static and dynamic factors, reduces likelihood of equipment failure, increases system performance, increases hydrocarbon recovery rate, increases the lifetime of a well, and increases total hydrocarbon recovery volume, according to embodiments described herein. The artificial lift plan defines which artificial lift approaches to use during certain operating periods, and further defines the operating period for which the approach is to be used. For example, an artificial lift plan can indicate to use an ESP approach for the first 12 months of a well's lifetime then switch to a rod lift approach for the next 13 months, etc.

According to some examples, generating the artificial lift plan can be based on a risk level determined or calculated using the first static factor, the second static factor, the first dynamic factor, and/or the second dynamic factor. For example, each of the factors can have a value associated therewith (e.g., a value [0,1]), which indicates a risk probability index. The risk probability index is a statistical term indicating a measure of the likelihood and severity of an event such as equipment failure, where 0 indicates no likelihood of failure and 1 indicates the certainty of failure. This value may change over the life of the well, based on parameters associated with the well that affect static risk factors (e.g., corrosiveness of the wellbore environment, deviations from a straight-line in the trajectory of the wellbore, etc.), and/or changes to operating conditions that affect dynamic risk factors (e.g. reduced production rate that requires lower operating speed for a pump.) The risk level can be used to determine which artificial lift approach to use at what time and for how long.

According to some examples, generating the artificial lift plan is based at least in part on an expected production value determined based on the first static factor, the second static factor, the first dynamic factor, and the second dynamic factor. The expected production value indicates the volume of hydrocarbons estimated to be recovered by each of the approaches, such as in volume per day.

At block 408, the hydrocarbons are extracted from the subterranean hydrocarbon reservoir based on the artificial lift plan by operating, at the well, at least one of the first artificial lift approach and the second artificial lift approach. For example, the hydrocarbons are extracted during a first period using a first artificial lift approach, then a second artificial lift approach is implemented to extract the hydrocarbons using the second artificial lift approach during a second period.

Additional processes also may be included. For example, the generation engine 312 can generate a revised artificial lift plan based on changes to the dynamic factors (e.g., the first dynamic factor, the second dynamic factor, etc.), such as while the respective first and second artificial lift approaches are used. In some examples, the evaluations at blocks 402 and/or 404 can be calculated on lifetime-based factors. For example, in the case of an ESP approach, the estimated lifetime of an ESP can be considered in the evaluation, including infant mortality of the pump as an increased risk level at the beginning of an operating interval for a pump (e.g., the pump fails within the first week of implementation).

It should be understood that the process depicted in FIG. 4 represents an illustration, and that other processes may be added or existing processes may be removed, modified, or rearranged without departing from the scope and spirit of the present disclosure.

Figure 5A:
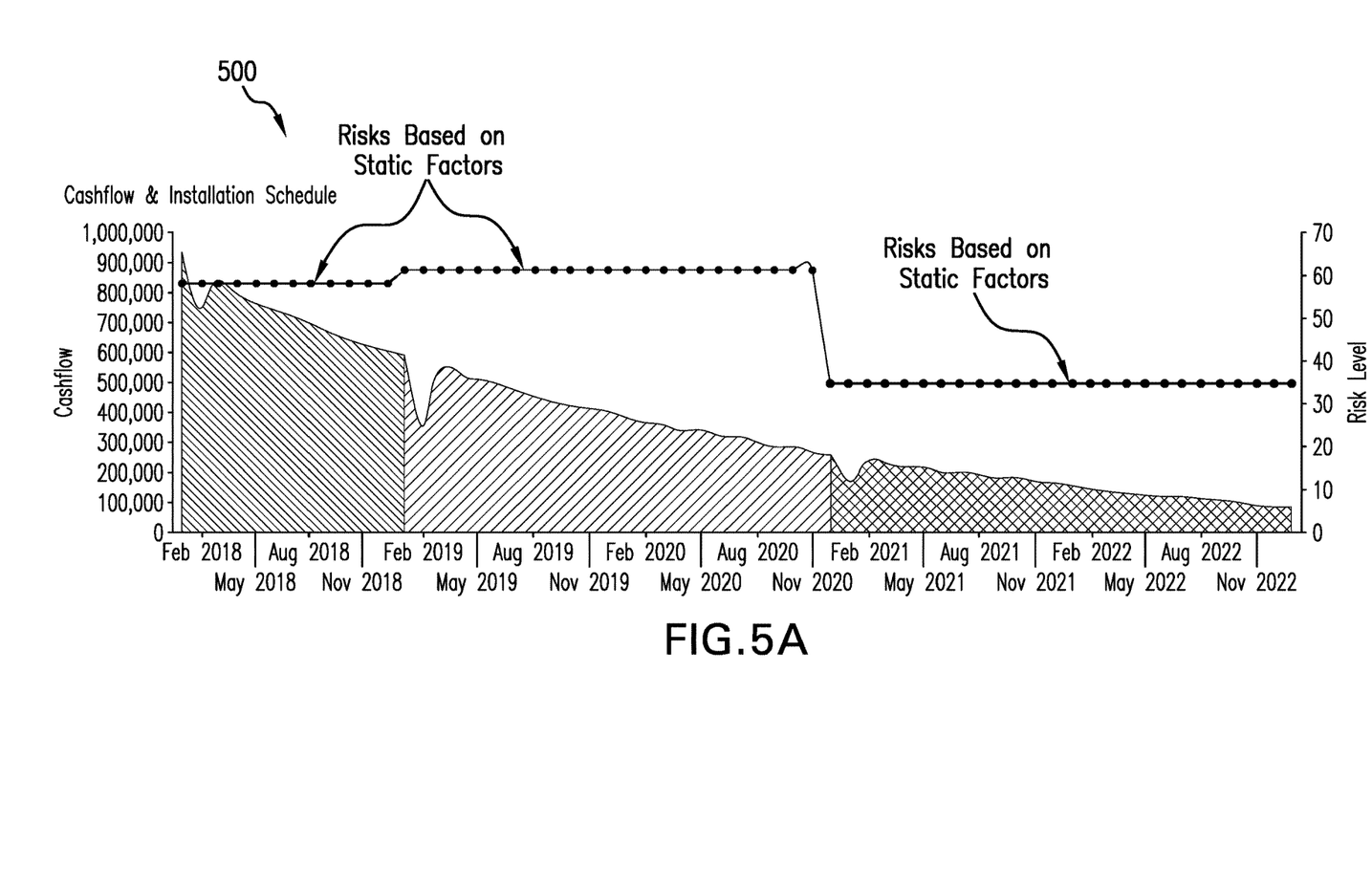
FIG. 5A depicts a line chart overlaid on the cash flow area chart, which represents a risk level based on static factors according to one or more embodiments described herein.
Figure 5B:
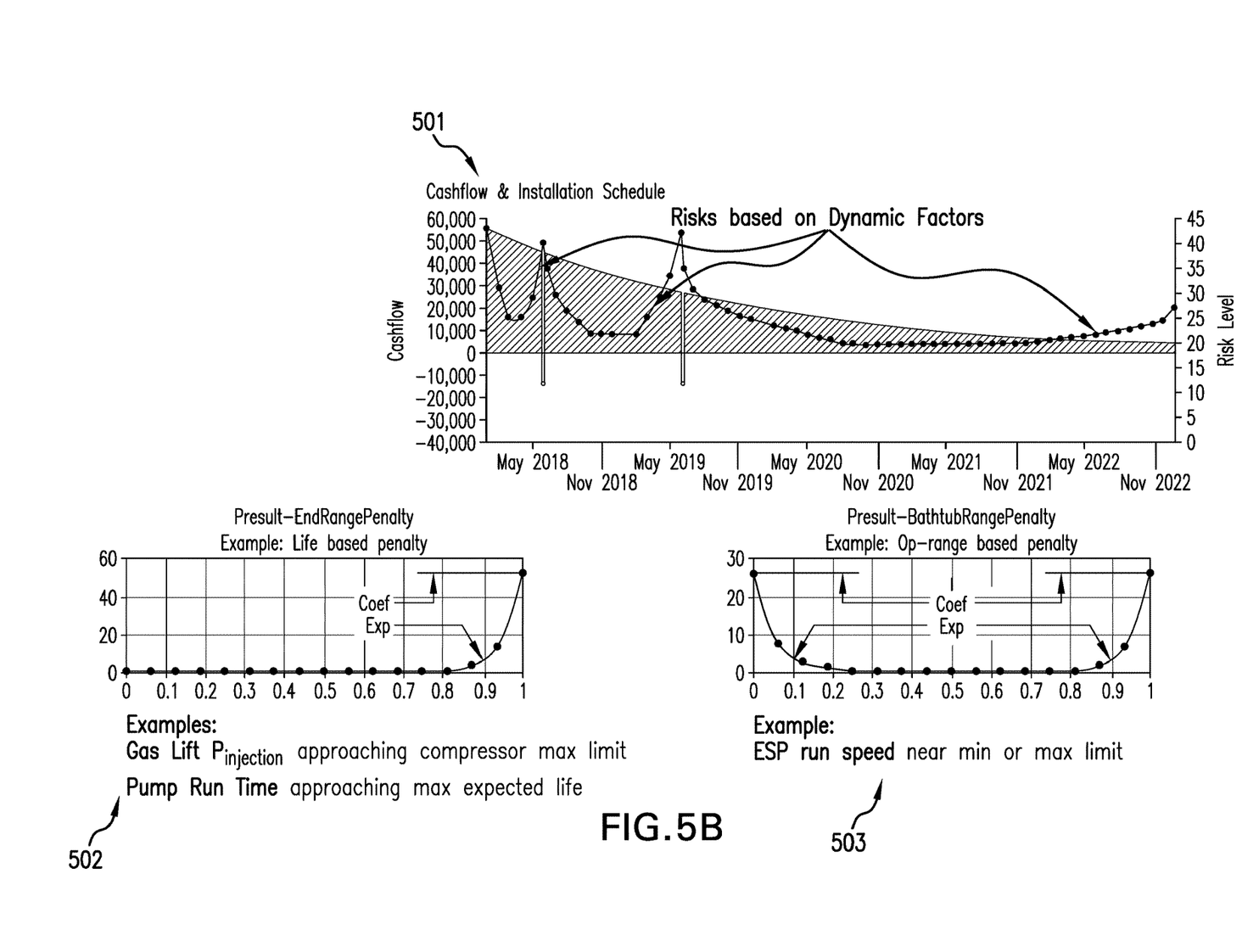
FIG. 5B depicts a line chart overlaid on the cash flow area chart, which represents a risk level based on dynamic factors according to one or more embodiments described herein.

Comparisons between artificial lift approaches require an evaluation of the tradeoff between desirable (value) and undesirable (risk) quantities. It is therefore advantageous to provide insight to the risk level associated with a given artificial lift approach. In an embodiment, FIG. 5A depicts a line chart 500 overlaid on the cash flow area chart, which represents a risk level based on static factors. Similarly, FIG. 5B depicts a line chart 501 overlaid on the cash flow area chart, which represents a risk level based on dynamic factors. As shown, the value is expected to change over time based on the variety of factors described above (e.g., static and/or dynamic factors). The magnitude of the risk level can be seen at any point during the analysis period from the charts 500 and 501. While it is helpful to assess the static risk levels as shown in chart 500, the exclusion of dynamic and life-based risk factors may fail to provide a thorough understanding of the risks associated with optionally implementing a particular plan. Contrarily, addressing static risk factors together with dynamic risk factors and life-based risk factors, as shown in chart 501, provides information that could be vital to the overall risk associated with implementation of a particular plan. Regarding the chart 501, two examples of penalty results are shown. Result 502 is an end range penalty result for an example of life-based penalty. In this example, gas lift $P_{injection}$ is approaching a compressor max limit, and pump run time is approaching a maximum expected life. Result 503 is a bathtub range penalty result for an example of operating range (op-range) based penalty. In this example, an ESP run speed is near a minimum or maximum limit.

Figure 6:
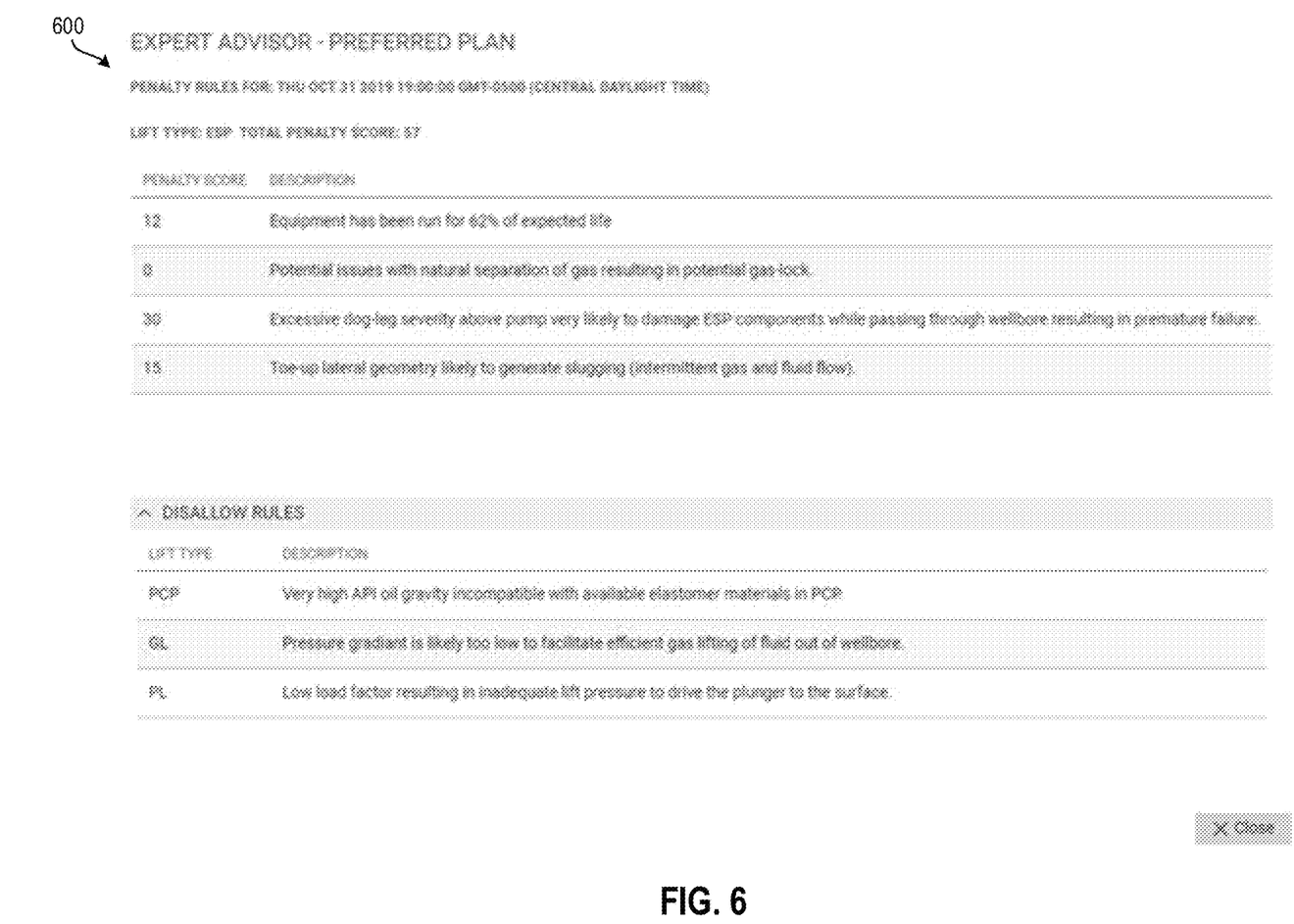
FIG. 6 depicts a screenshot of an expert advisor interface according to one or more embodiments described herein.

Since the factors contributing to technical risk or suitability of the various artificial lift approaches are likely to vary between different operators, regions, and other qualifiers, it is useful to provide insights as to the source of risk. A construct to provide this insight is depicted in FIG. 6. In particular, FIG. 6 depicts a screenshot of an expert advisor interface 600 according to one or more embodiments described herein. The expert advisor interface 600 can provide a summary list that shows the breakdown of risks factors that form the total risk level at any point within a lift plan timeframe. The risk elements include static, dynamic, and/or life-based factors associated with the selected timeframe. The expert advisor interface 600 can also list identified artificial lift types that failed certain logical tests that are considered within the plan. These logical tests may be referred to as "disallow rules" and viewing the triggered disallow rules for a plan indicates the reason why a particular artificial lift approach is excluded for consideration or is otherwise deemed inappropriate.

Figure 7:
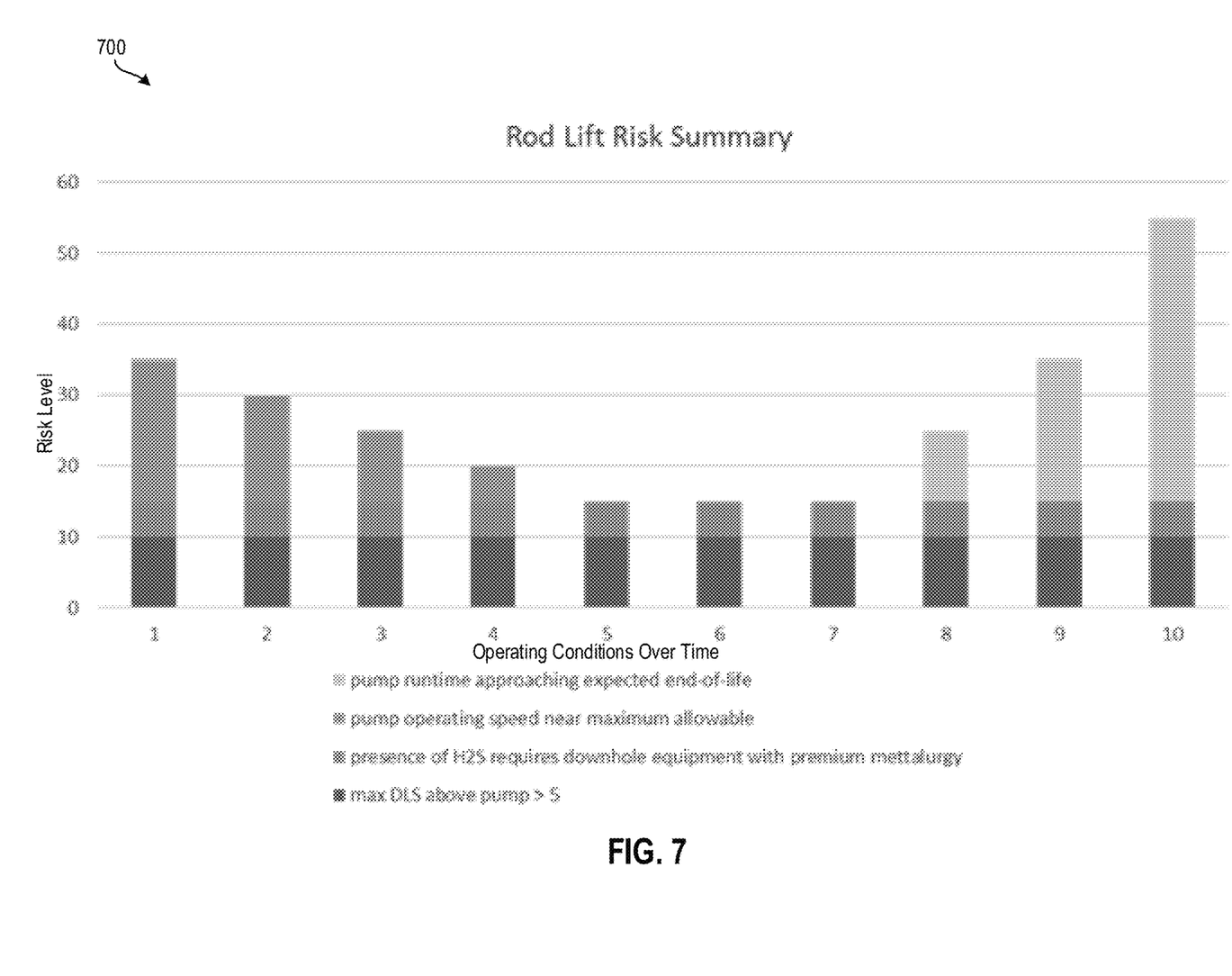
FIG. 7 depicts a chart to display risk elements at each point in time of operation of an artificial lift approach according to one or more embodiments described herein.

FIG. 7 depicts a chart 700 to display risk elements at each point in time of operation of an artificial lift approach according to one or more embodiments described herein. Risk factors (static, dynamic, and lifetime-based) can be displayed to show the changing contribution of various risk elements to the total risk level over time. According to one or more embodiments described herein, a stacked bar chart is used to display the risk elements at each point in time for an artificial lift approach that is operational. From the example shown, it can be seen that several static risk elements persist from the beginning to the end of the artificial lift configuration operational period. It can also be seen that a dynamic risk element—"pump operating speed near maximum allowable"—contributes to increased risk at the beginning of the operational period. Finally, the life-based risk element—"pump runtime approaching expected end-of-life"—increase the risk level at the final operating points of the run period.

It is understood that the present disclosure is capable of being implemented in conjunction with any other type of computing environment now known or later developed. For example, FIG. 8 depicts a block diagram of a processing system 800 for implementing the techniques described herein. In examples, processing system 800 has one or more central processing units (processors) 821a, 821b, 821c, etc. (collectively or generically referred to as processor(s) 821 and/or as processing device(s)). In aspects of the present disclosure, each processor 821 can include a reduced instruction set computer (RISC) microprocessor. Processors 821 are coupled to system memory (e.g., random access memory (RAM) 824) and various other components via a system bus 833. Read only memory (ROM) 822 is coupled to system bus 833 and may include a basic input/output system (BIOS), which controls certain basic functions of processing system 800.

Further depicted are an input/output (I/O) adapter 827 and a network adapter 826 coupled to system bus 833. I/O adapter 827 may be a small computer system interface (SCSI) adapter that communicates with a hard disk 823 and/or a tape storage drive 825 or any other similar component. I/O adapter 827, hard disk 823, and tape storage device 825 are collectively referred to herein as mass storage 834. Operating system 840 for execution on processing system 800 may be stored in mass storage 834. The network adapter 826 interconnects system bus 833 with an outside network 836 enabling processing system 800 to communicate with other such systems.

A display (e.g., a display monitor) 835 is connected to system bus 833 by display adaptor 832, which may include a graphics adapter to improve the performance of graphics intensive applications and a video controller. In one aspect of the present disclosure, adapters 826, 827, and/or 232 may be connected to one or more I/O busses that are connected to system bus 833 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 833 via user interface adapter 828 and display adapter 832. A keyboard 829, mouse 830, and speaker 831 may be interconnected to system bus 833 via user interface adapter 828, which may include, for example, a Super I/O chip integrating multiple device adapters into a single integrated circuit.

In some aspects of the present disclosure, processing system 800 includes a graphics processing unit 837. Graphics processing unit 837 is a specialized electronic circuit designed to manipulate and alter memory to accelerate the creation of images in a frame buffer intended for output to a display. In general, graphics processing unit 837 is very efficient at manipulating computer graphics and image processing, and has a highly parallel structure that makes it more effective than general-purpose CPUs for algorithms where processing of large blocks of data is done in parallel.

Thus, as configured herein, processing system 800 includes processing capability in the form of processors 821, storage capability including system memory (e.g., RAM 824), and mass storage 834, input means such as keyboard 829 and mouse 830, and output capability including speaker 831 and display 835. In some aspects of the present disclosure, a portion of system memory (e.g., RAM 824) and mass storage 834 collectively store an operating system to coordinate the functions of the various components shown in processing system 800.

The teachings of the present disclosure may be used in a variety of well operations. These operations may involve using one or more treatment agents to treat a formation, the fluids resident in a formation, a wellbore, and/or equipment in the wellbore, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

Set forth below are some embodiments of the foregoing disclosure:

Embodiment 1

A method includes: performing, by a processing device, an evaluation of an artificial lift approach that can be operated at a well having a subterranean hydrocarbon reservoir, the evaluation being based at least in part on a static factor associated with operating the artificial lift approach in the well and a dynamic factor associated with operating the artificial lift approach at a operating condition; generating, by the processing device, an artificial lift plan based at least in part on the evaluation; and extracting the hydrocarbons from the subterranean hydrocarbon reservoir based on the artificial lift plan by operating, at the well, the artificial lift approach.

Embodiment 2

The method of any prior embodiment, the method further including generating, by the processing device, a revised artificial lift plan based at least in part on a change to the dynamic factor while extracting the hydrocarbons from the subterranean hydrocarbon reservoir.

Embodiment 3

The method of any prior embodiment, wherein the artificial lift plan increases a hydrocarbon recovery rate, increases a lifetime of a well, and increases a hydrocarbon recovery volume.

Embodiment 4

The method of any prior embodiment, wherein the evaluation is further based at least in part on a lifetime-based factor.

Embodiment 5

The method of any prior embodiment, wherein generating the artificial lift plan is based at least in part on an expected risk value determined based on the static and the dynamic factor.

Embodiment 6

A method includes performing, by a processing device, a first evaluation of a first artificial lift approach that can be operated at a well having a subterranean hydrocarbon reservoir, the first evaluation being based at least in part on a first static factor associated with operating the first artificial lift approach in the well and a first dynamic factor associated with operating the first artificial lift approach at a first operating condition; performing, by a processing device, a second evaluation of a second artificial lift approach that can be operated at the well having the subterranean hydrocarbon reservoir, the second evaluation being based at least in part on a second static factor associated with operating the second artificial lift approach in the well and a second dynamic factor associated with operating the second artificial lift approach at a second operating condition; generating, by the processing device, an artificial lift plan based at least in part on the first evaluation and the second evaluation; and extracting the hydrocarbons from the subterranean hydrocarbon reservoir based on the artificial lift plan by operating, at the well, at least one of the first artificial lift approach and the second artificial lift approach.

Embodiment 7

The method of any prior embodiment, the method further including generating, by the processing device, a revised artificial lift plan based at least in part on a change to at least one of the first dynamic factor and the second dynamic factor while extracting the hydrocarbons from the subterranean hydrocarbon reservoir.

Embodiment 8

The method of any prior embodiment, wherein the artificial lift plan increases a hydrocarbon recovery rate, increases a lifetime of a well, and increases a hydrocarbon recovery volume.

Embodiment 9

The method of any prior embodiment, wherein the artificial lift plan defines a plurality of artificial lift approaches and an operational period associated with each of the plurality of artificial lift approaches.

Embodiment 10

The method of any prior embodiment, wherein plurality of artificial lift approaches utilizes an artificial lift system selected from the group consisting of a gas lift system, an electric submersible pump (ESP) system, a progressing cavity pumping system, a rod lift system, and a plunger lift system.

Embodiment 11

The method of any prior embodiment, wherein at least one of the first evaluation and the second evaluation is further based at least in part on a lifetime-based factor.

Embodiment 12

The method of any prior embodiment, wherein the lifetime-based factor indicates an expected lifetime of a component of a system implementing the at least one of the first artificial lift approach and the second artificial lift approach.

Embodiment 13

The method of any prior embodiment, wherein generating the artificial lift plan is based at least in part on an expected risk value determined based on the first static factor, the second static factor, the first dynamic factor, and the second dynamic factor.

Embodiment 14

The method of any prior embodiment, wherein generating the artificial lift plan is based at least in part on an expected production value determined based on the first static factor, the second static factor, the first dynamic factor, and the second dynamic factor.

Embodiment 15

A system is provided, system including a memory comprising computer readable instructions; and a processing device for executing the computer readable instructions for performing a method including: performing, by the processing device, a first evaluation of a first artificial lift approach that can be operated at a well having a subterranean hydrocarbon reservoir, the first evaluation being based at least in part on a first static factor associated with operating the first artificial lift approach in the well and a first dynamic factor associated with operating the first artificial lift approach at a first operating condition; performing, by a processing device, a second evaluation of a second artificial lift approach that can be operated at the well having the subterranean hydrocarbon reservoir, the second evaluation being based at least in part on a second static factor associated with operating the second artificial lift approach in the well and a second dynamic factor associated with operating the second artificial lift approach at a second operating condition; generating, by the processing device, an artificial lift plan based at least in part on the first evaluation and the second evaluation; and extracting the hydrocarbons from the subterranean hydrocarbon reservoir based on the artificial lift plan by operating, at the well, at least one of the first artificial lift approach and the second artificial lift approach.

Embodiment 16

The system of any prior embodiment wherein the method further comprises generating, by the processing device, a revised artificial lift plan based at least in part on a change to at least one of the first dynamic factor and the second dynamic factor while extracting the hydrocarbons from the subterranean hydrocarbon reservoir.

Embodiment 17

The system of any prior embodiment, wherein the artificial lift plan increases a hydrocarbon recovery rate, increases a lifetime of a well, and increases a hydrocarbon recovery volume.

Embodiment 18

The system of any prior embodiment, wherein the artificial lift plan defines a plurality of artificial lift approaches and an operational period associated with each of the plurality of artificial lift approaches.

Embodiment 19

The system of any prior embodiment, wherein plurality of artificial lift approaches utilizes an artificial lift system selected from the group consisting of a gas lift system, an electric submersible pump (ESP) system, a progressing cavity pumping system, a rod lift system, and a plunger lift system.

Embodiment 20

The system of any prior embodiment, wherein the first evaluation is further based at least in part on a first lifetime-based factor, and wherein the second evaluation is further based at least in part on a second lifetime-based factor.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list of at least two terms is intended to mean any term or combination of terms. The term "coupled" relates to a first component being coupled to a second component either directly or indirectly via an intermediary component. The term "configured" relates to one or more structural limitations of a device that are required for the device to perform the function or operation for which the device is configured.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While one or more embodiments have been shown and described, modifications and substitutions may be made thereto without departing from the spirit and scope of the invention. Accordingly, it is to be understood that the present invention has been described by way of illustrations and not limitation.

It will be recognized that the components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method comprising:
    performing, by a processing device, an evaluation of a first artificial lift approach in a plurality of lift approaches that can be operated at a well having a subterranean hydrocarbon reservoir, the first artificial lift approach comprising a first artificial lift apparatus, the evaluation providing a first overall risk level that is based at least in part on a static factor associated with operating the first artificial lift approach in the well, a dynamic factor associated with operating the first artificial lift approach at an operating condition, and a lifetime-based factor that is a function of an operational time period for the first artificial lift approach;
    generating, by the processing device, an artificial lift plan based at least in part on the first overall risk level and a second overall risk level, wherein the artificial lift plan defines at least (i) a first operational time period for the first artificial lift approach and (ii) a second operational time period for a second artificial lift approach in the plurality of lift approaches, the second overall risk level being associated with the second artificial lift approach, the second lift approach comprising a second artificial lift apparatus that is different from the first artificial lift apparatus;
    generating an interface to be displayed on a display, the interface comprising a breakdown of risk factors that form the risk level at a point within a lift plan timeframe, wherein the risk factors comprise the dynamic factor, the static factor, and the lifetime-based factor that are associated with the point within the lift plan timeframe, wherein the interface further comprises an indication of an excluded artificial lift approach that is excluded for consideration from the artificial lift plan and a reason for being excluded, the excluded artificial lift approach comprising an excluded artificial lift apparatus different from the first and second artificial lift apparatuses; and
    extracting hydrocarbons from the subterranean hydrocarbon reservoir based on the artificial lift plan by operating, at the well, the first artificial lift approach for the first operational time period to provide a first expected production volume of hydrocarbons at the first overall risk level and, subsequent to the first operational time period, operating the second artificial lift approach for the second operational time period to provide a second expected production volume of hydrocarbons at the second overall risk level; wherein the first expected production volume in the first operational time period is greater than an expected production volume that would be produced by the second artificial approach in the first operational time period.

2. The method of claim 1, further comprising generating, by the processing device, a revised artificial lift plan based at least in part on a change to the dynamic factor while extracting the hydrocarbons from the subterranean hydrocarbon reservoir.

3. The method of claim 1, wherein the artificial lift plan increases a hydrocarbon recovery rate, increases a lifetime of the well, and increases a hydrocarbon recovery volume.

4. A method comprising:
    performing, by a processing device, a first evaluation of a first artificial lift approach that can be operated at a well having a subterranean hydrocarbon reservoir, the first artificial lift approach comprising a first artificial lift apparatus, the first evaluation being based at least in part on a first static factor associated with operating the first artificial lift approach in the well, a first dynamic factor associated with operating the first artificial lift approach at a first operating condition, and a first lifetime-based factor that is a function of a first operating time for the first artificial lift approach;
    performing, by the processing device, a second evaluation of a second artificial lift approach that can be operated at the well having the subterranean hydrocarbon reservoir, the second artificial lift approach comprising a second artificial lift apparatus different from the first artificial lift apparatus, the second evaluation being based at least in part on a second static factor associated with operating the second artificial lift approach in the well, a second dynamic factor associated with operating the second artificial lift approach at a second operating condition, and a second lifetime-based factor that is a function of a second operating time for the second artificial lift approach;
    generating, by the processing device, an artificial lift plan based at least in part on the first evaluation, the second evaluation, and an overall risk level determined based at least in part on at least one of the first static factor, the second static factor, the first dynamic factor, the second dynamic factor, the first lifetime-based factor, or the second lifetime-based factor, wherein the artificial lift plan defines at least (i) a first operational time period for the first artificial lift approach and (ii) a second operational time period for the second artificial lift approach;
    extracting hydrocarbons from the subterranean hydrocarbon reservoir based on the artificial lift plan by operating, at the well, the first artificial lift approach for the first operational time period to provide a first expected production volume of hydrocarbons at the overall risk level;
    generating an interface to be displayed on a display, wherein the interface further comprises an indication of an excluded artificial lift approach that is excluded for consideration from the artificial lift plan and a reason for being excluded, the excluded artificial lift approach comprising an excluded artificial lift apparatus different from the first and second artificial lift apparatuses; and subsequent to the first operational period, operating the second artificial lift approach for the second operational time period to provide a second expected production volume of hydrocarbons at the overall risk level; wherein the first expected production volume in the first operational time period is greater than an expected production volume that would be produced by the second artificial approach in the first operational time period.

5. The method of claim 4, further comprising generating, by the processing device, a revised artificial lift plan based at least in part on a change to at least one of the first dynamic factor and the second dynamic factor while extracting the hydrocarbons from the subterranean hydrocarbon reservoir.

6. The method of claim 4, wherein the artificial lift plan increases a hydrocarbon recovery rate, increases a lifetime of the well, and increases a hydrocarbon recovery volume.

7. The method of claim 1, wherein the first artificial lift approach utilizes the first artificial lift apparatus selected from the group consisting of a gas lift system, an electric submersible pump (ESP) system, a progressing cavity pumping system, a rod lift system, and a plunger lift system.

8. The method of claim 4, wherein the first lifetime-based factor indicates a first expected lifetime of a first component of a first system implementing the first artificial lift approach and wherein the second lifetime-based factor indicates a second expected lifetime of a second component of a second system implementing the second artificial lift approach.

9. The method of claim 4, wherein generating the artificial lift plan is based at least in part on the expected production value determined based on the first static factor, the second static factor, the first dynamic factor, and the second dynamic factor.

10. A system comprising:
a memory comprising computer readable instructions; and
a processing device for executing the computer readable instructions for performing a method comprising:
performing, by the processing device, a first evaluation of a first artificial lift approach that can be operated at a well having a subterranean hydrocarbon reservoir, the first artificial lift approach comprising a first artificial lift apparatus, the first evaluation being based at least in part on a first static factor associated with operating the first artificial lift approach in the well, a first dynamic factor associated with operating the first artificial lift approach at a first operating condition, and a first lifetime-based factor that is a function of a first operating time for the first artificial lift approach;
performing, by the processing device, a second evaluation of a second artificial lift approach that can be operated at the well having the subterranean hydrocarbon reservoir, the second artificial lift approach comprising a second artificial lift apparatus different from the first artificial lift apparatus, the second evaluation being based at least in part on a second static factor associated with operating the second artificial lift approach in the well, a second dynamic factor associated with operating the second artificial lift approach at a second operating condition, and a second lifetime-based factor that is a function of a second operating time for the second artificial lift approach;

generating, by the processing device, an artificial lift plan based at least in part on the first evaluation, the second evaluation, and an overall risk level determined based at least in part on at least one of the first static factor, the second static factor, the first dynamic factor, the second dynamic factor, the first lifetime-based factor, or the second lifetime-based factor, wherein the artificial lift plan defines at least (i) a first operational time period for the first artificial lift approach and (ii) a second operational time period for the second artificial lift approach;

generating an interface to be displayed on a display, the interface comprising a stacked bar chart comprising indicia for the first static factor and the first dynamic factor at a plurality of points in time for the first artificial lift approach; and extracting hydrocarbons from the subterranean hydrocarbon reservoir based on the artificial lift plan by operating, at the well, the first artificial lift approach for the first operational time period to provide a first expected production volume of hydrocarbons at the overall risk level and, subsequent to the first operational period, operating the second artificial lift approach for the second operational time period to provide a second expected production volume of hydrocarbons at the overall risk level; wherein the first expected production volume in the first operational time period is greater than an expected production volume that would be produced by the second artificial approach in the first operational time period.

11. The system of claim 10, wherein the method further comprises generating, by the processing device, a revised artificial lift plan based at least in part on a change to at least one of the first dynamic factor and the second dynamic factor while extracting the hydrocarbons from the subterranean hydrocarbon reservoir.

12. The system of claim 10, wherein the artificial lift plan increases a hydrocarbon recovery rate, increases a lifetime of the well, and increases a hydrocarbon recovery volume.

13. The system of claim 10, wherein the first artificial lift approach utilizes the first artificial lift apparatus selected from the group consisting of a gas lift system, an electric submersible pump (ESP) system, a progressing cavity pumping system, a rod lift system, and a plunger lift system.

14. The system of claim 10, wherein the first evaluation is further based at least in part on the first lifetime-based factor, and wherein the second evaluation is further based at least in part on the second lifetime-based factor.

15. The method of claim 1, wherein the lifetime-based factor comprises an infant mortality of a component of the artificial lift approach, wherein the infant mortality of the component is an increased risk level at a beginning of an operating interval for the component that diminishes over time.

16. The method of claim 1, wherein the first artificial lift apparatus and the second artificial lift apparatus are selected from the group consisting of a gas lift system, an electric submersible pump (ESP) system, a progressing cavity pumping system, a rod lift system, and a plunger lift system, and wherein the first artificial lift apparatus differs from the second artificial lift apparatus.

* * * * *